(12) United States Patent
Pfnuer et al.

(10) Patent No.: US 10,209,464 B2
(45) Date of Patent: Feb. 19, 2019

(54) DIRECT PRINTED CIRCUIT ROUTING TO STACKED OPTO-ELECTRICAL IC PACKAGES

(71) Applicant: Cisco Technology, Inc., San Jose, CA (US)

(72) Inventors: Stefan Martin Pfnuer, San Jose, CA (US); Matthew Joseph Traverso, Santa Clara, CA (US); Bipin Dama, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 137 days.

(21) Appl. No.: 14/517,477

(22) Filed: Oct. 17, 2014

(65) Prior Publication Data
US 2016/0109668 A1     Apr. 21, 2016

(51) Int. Cl.
*G02B 6/42* (2006.01)
*H05K 1/18* (2006.01)
*G02F 1/01* (2006.01)

(52) U.S. Cl.
CPC ........... *G02B 6/4257* (2013.01); *G02B 6/428* (2013.01); *G02F 1/011* (2013.01); *H05K 1/182* (2013.01);
(Continued)

(58) Field of Classification Search
CPC ...... G02B 6/125; G02B 6/423; G02B 6/3652; G02B 6/122; G02B 6/12119
See application file for complete search history.

(56) References Cited

U.S. PATENT DOCUMENTS

| 6,095,697 A * | 8/2000 | Lehman | G02B 6/423 |
| | | | 385/88 |
| 6,512,861 B2 * | 1/2003 | Chakravorty | G02B 6/42 |
| | | | 385/14 |

(Continued)

FOREIGN PATENT DOCUMENTS

| CN | 103650140 A | 3/2014 |
| KR | 20090016145 A | 2/2009 |
| WO | 2008109235 A2 | 9/2008 |

OTHER PUBLICATIONS

Fjelstad, Joseph C., Tutorial: An Overview of Flexible Printed Circuit Technology, ChipScale Review Magazine, Jan.-Feb. 2001, Issue 0101, <http://www.chipscalereview.com/issues/ES/issues/0101/tutorial_01.html>.

(Continued)

*Primary Examiner* — Ryan Lepisto
*Assistant Examiner* — Erin Chiem
(74) *Attorney, Agent, or Firm* — Patterson + Sheridan, LLP

(57) ABSTRACT

An optical transmitter may include a chip stack that includes an electrical IC that is mounted using solder balls to a photonic chip. These solder connections permit the electrical IC and the photonic chip to communicate. In addition, the transmitter may include a PCB coupled to the stack so that electrical signals in the PCB are transmitted to the IC and photonic chip (and vice versa). Instead of coupling the PCB to the stack using wire bonds attached to pads on a surface of the photonic chip, at least a portion of the PCB is disposed between the photonic chip and electrical IC. The PCB may also include bond pads used to form a direct solder connection to the electrical IC. As such, the electrical IC may include direct solder connections to both the PCB and the photonic chip.

17 Claims, 8 Drawing Sheets

(52) U.S. Cl.
CPC .......... *G02B 6/4204* (2013.01); *G02B 6/4232* (2013.01); *H05K 1/181* (2013.01); *H05K 2201/09063* (2013.01); *H05K 2201/1053* (2013.01); *H05K 2201/10121* (2013.01); *H05K 2201/10446* (2013.01)

(56) References Cited

U.S. PATENT DOCUMENTS

| | | | |
|---|---|---|---|
| 6,709,607 B2 * | 3/2004 | Hibbs-Brenner | G02B 6/26 216/24 |
| 6,754,406 B2 * | 6/2004 | Kaneshiro | G02B 6/423 385/14 |
| 7,049,704 B2 * | 5/2006 | Chakravorty | G02B 6/42 257/737 |
| 7,153,043 B1 | 12/2006 | Zhang et al. | |
| 7,263,248 B2 * | 8/2007 | Windover | H04B 10/801 385/14 |
| 7,329,054 B1 * | 2/2008 | Epitaux | G02B 6/4249 385/89 |
| 7,539,366 B1 * | 5/2009 | Baks | G02B 6/4201 385/14 |
| 8,588,561 B2 | 11/2013 | Zbinden et al. | |
| 8,926,194 B2 * | 1/2015 | Chang | G02B 6/36 385/89 |
| 9,252,521 B1 * | 2/2016 | Beaman | H01R 12/718 |
| 2002/0057876 A1 | 5/2002 | Yamabayashi et al. | |
| 2005/0156310 A1 * | 7/2005 | Benner | G02B 6/4212 257/712 |
| 2005/0189548 A1 | 9/2005 | Nagai et al. | |
| 2012/0207426 A1 * | 8/2012 | Doany | G02B 6/426 385/14 |
| 2014/0064659 A1 | 3/2014 | Doerr et al. | |
| 2014/0177999 A1 | 6/2014 | Yanagisawa | |
| 2014/0254973 A1 | 9/2014 | Tatsuo et al. | |
| 2015/0153524 A1 * | 6/2015 | Chen | G02B 6/4228 385/14 |

OTHER PUBLICATIONS

International Search Report for PCT/US2015/055663, dated Jan. 28, 2016.

* cited by examiner

DIRECT PRINTED CIRCUIT ROUTING TO STACKED OPTO-ELECTRICAL IC PACKAGES

TECHNICAL FIELD

Embodiments presented in this disclosure generally relate to communicatively coupling a signal routing material (e.g., flexible or rigid printed circuit board (PCB)) to an electrical integrated circuit (IC) and photonic chip. More specifically, embodiments disclosed herein directly connect the signal routing material to the electrical IC or the photonic chip by disposing the material between the electrical IC and photonic chip.

BACKGROUND

Optical subassemblies such as transmitters or receivers are commonly used in a variety of different applications such as 40/100G small form-factor pluggable (SFP) transceiver connector, quad small form-factor pluggable (QSPF) connectors, and QSPF28 connectors. These connectors often stack the electrical IC and photonic chip which reduces power consumption, package size, and cost and may improve performance. However, shrinking CMOS node sizes for electrical ICs require higher I/O and denser routing which increases impedance and inductance values for electrical routing. This problem only grows worse as the electrical IC performs additional functions such as driving external circuits or performing data recovery/error correction. Moreover, using multiple lanes of differential high speed I/O (e.g., 40/100G or +100G transceivers using advanced modulation schemes) may also require additional routing relative to a system that has less bandwidth or functionality.

Typically, the PCB is communicatively coupled to the electrical IC via one or more redistribution layers in the photonic chip. For example, the transmitter may include a plurality of wire bonds that connect the PCB to bond pads on the photonic chip. From there, the photonic chip uses its redistribution layers to carry electrical signals to the electrical IC. However, as the number of I/O routes increases, the redistribution layers in the photonic chips may be insufficient for routing electrical signals between the PCB and the electrical IC.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DESCRIPTION OF EXAMPLE EMBODIMENTS

Overview

Figure 1:
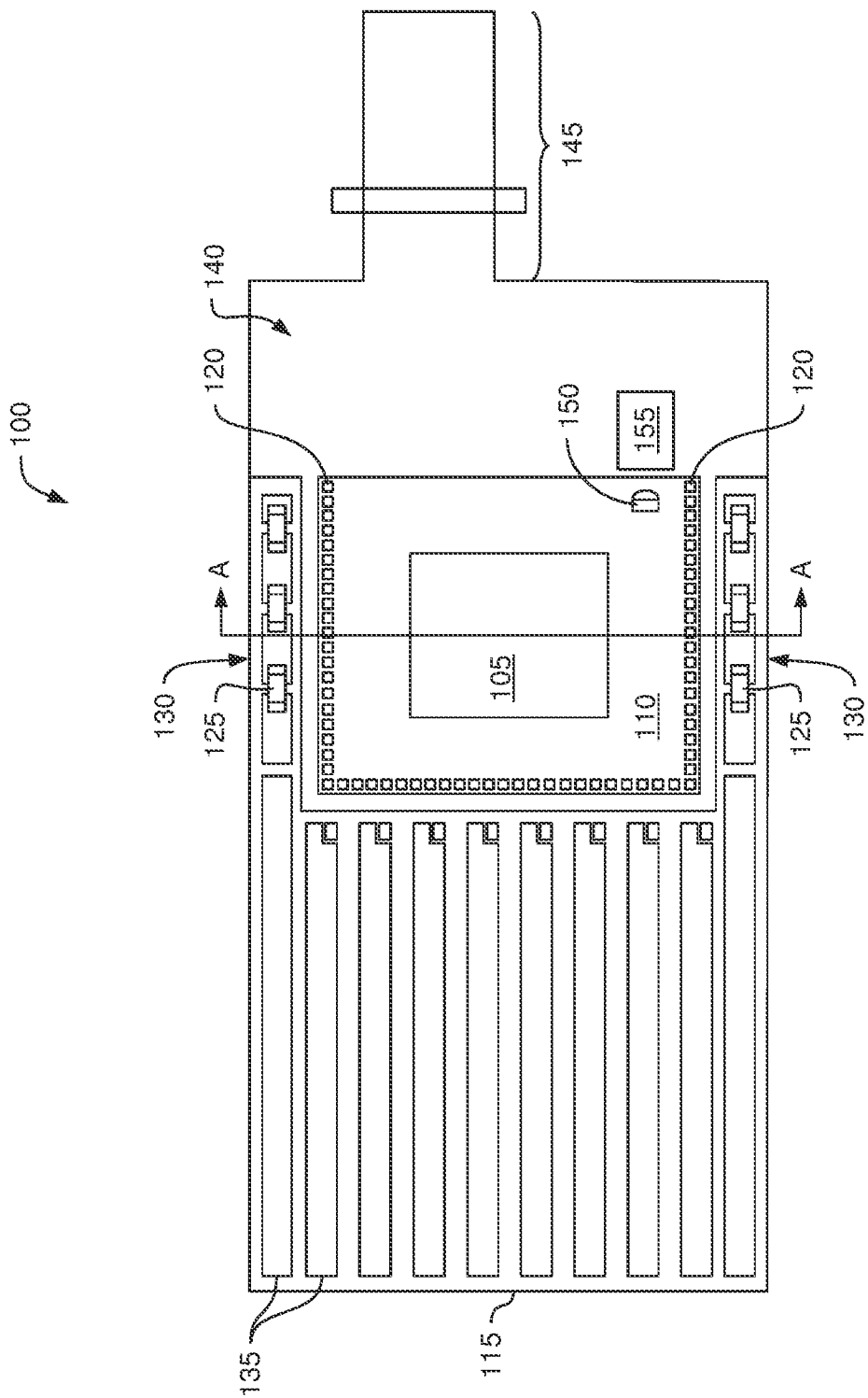
FIG. 1 is an optical transmitter, according to one embodiment described herein.

One embodiment presented in this disclosure is an photonic chip that includes a first surface and a second surface that are both normal to a common direction, where the second surface is recessed relative to the first surface along the common direction to form an alignment area. Furthermore, a depth of the alignment area is greater than or equal to a thickness of a portion of a PCB, thereby permitting a top surface of the PCB to substantially align with the first surface when placed in the alignment area. The photonic chip also includes a bonding region disposed on the first surface, the bonding region comprises a plurality of bond pads configured to form electrical connections to an electrical IC and an optical component electrically coupled to at least one of the plurality of bond pads. The optical component is configured to transmit an optical signal within the photonic chip.

Another embodiment presented in this disclosure is an optical system that includes an electrical IC comprising a bottom surface and a photonic chip including a top surface and a recessed surface both facing the bottom surface of the IC where the recessed surface is further from the bottom surface of the IC than the top surface relative to a direction that is normal to the top and recessed surfaces. Furthermore, the IC overlays both the top and recessed surfaces. The optical system also includes a portion of a signal routing material disposed between the bottom surface of the IC and the recessed surface of the photonic chip where the portion of the signal routing material and the top surface of the photonic chip each including a plurality of respective electrical connections to the bottom surface of the IC.

Another embodiment described in this disclosure is a method that includes connecting a signal routing material to a bottom surface of an electrical IC using a first plurality of solder bump connections and disposing a portion of the signal routing material comprising the first plurality of electrical connections in an alignment region of a photonic chip. The alignment region is defined, at least in part, by a distance between a recessed surface of the photonic chip and a top surface of the photonic chip relative to a direction normal to both the recessed and top surfaces where the top and recessed surfaces both face the bottom surface of the IC. Furthermore, the portion of the signal routing material is between the bottom surface of the IC and the recessed surface of the photonic chip. The method also includes connecting the bottom surface of the IC to the top surface of the photonic chip using a second plurality of electrical connections.

Example Embodiments

An optical transmitter may include a chip stack that includes an electrical IC mounted using solder balls or copper pillars (Cu-pillar) to a photonic chip. These solder connections permit the electrical IC and the photonic chip to communicate. In addition, the transmitter may include a PCB coupled to the stack so that electrical signals in the PCB are transmitted to the IC and photonic chip (and vice versa). Instead of coupling the PCB to the stack using wire bonds attached to pads on a surface of the photonic chip, at least a portion of the PCB is disposed between the photonic chip and electrical IC. The PCB may also include bond pads used to form a direct solder connection to the electrical IC. That is, instead of relying on redistribution layers in the photonic chip to carry electrical signals between the PCB and electrical IC, the PCB communicates directly with the electrical IC using the solder connections. Furthermore, in one embodiment, the electrical IC still maintains one or more solder connections with the photonic chip. That is, the electrical IC includes direct solder connections to both the PCB and the photonic chip.

In one embodiment, the photonic chip is processed to include a surface that is recessed relative to a top layer of the photonic chip that is coupled to the electrical IC, thereby creating a region in which the PCB can be disposed between the photonic chip and the IC. Once the electrical IC is connected to the PCB and photonic chip, an underfill material may be used to mechanically stabilize these connections as well as couple the PCB to the recessed surface of the photonic chip. Furthermore, the region created by the recessed layer may include one or more raised features in the photonic chip. The height of the raised features may extend from the recessed surface to the top layer of the photonic chip. In one embodiment, the raised features are also coupled to the electrical IC which may increase the mechanical stability of the stack. For example, the raised features may also be connected to the electrical IC using solder balls. In addition to providing mechanical stability, the solder connections on the raised features may be used to communicate electrical signals between the electrical IC and the photonic chip.

FIG. 1 is an optical transmitter 100, according to one embodiment described herein. The transmitter 100 includes an electrical IC 105 mounted to a photonic chip 110. Although not shown by the top view illustrated in FIG. 1, the electrical IC 105 may be mounted to the chip 110 using a plurality of direct solder connections. The electrical IC 105 may include CMOS circuitry that provides data signals to the photonic chip 110. The photonic chip 110 may also include CMOS circuitry but also includes optical components such as waveguides, phase modulators, optical splitters, and the like which may be electrically coupled to the solder connections. These optical components transmit or carry optical signals through the photonic chip 110 and may use control signals received via the solder connections to perform their respective function.

The optical transmitter 100 also includes a PCB 115 which includes a plurality of electrical traces 135. For example, these traces 135 may be high-speed differential signal pairs that are transmitted to and from the electrical IC 105 via the photonic chip 110. In one embodiment, the PCB 115 may be a flex PCB which enables the PCB 115 and the traces 135 to curve or twist rather than remaining substantially planar as in a rigid PCB. Furthermore, FIG. 1 illustrates only one layer of the PCB 115. In one embodiment, the PCB 115 includes multiple layers with respective traces for routing data or power signals to, and from, the electrical IC 105 and photonic chip 110.

To route electrical signals between the PCB and the IC 105 and/or photonic chip 110, the optical chip 110 includes a plurality of bond pads 120 located on the periphery of a top surface. Although not shown, wire bonds may be used to connect the bond pads 120 to the traces 135 on the PCB 115. However, due to process restrictions, lining one side of the top surface of the photonic chip 110 with bond pads 120 may be insufficient to accommodate all the necessary data and power signals. In one example, the bond pads 120 are spaced at least 60 microns apart which restricts the number of bond pads 120 that can be placed on any one side. Moreover, because of the high impedance corresponding to wire bonds, multiple parallel wire bonds may be used to reduce the impedance for a single high-speed data connection. But using these redundant connections further increases the number of wire bonds and bond pads 120 needed on the photonic chip 110. As such, in this example, the bond pads 120 line three sides of the top surface of the photonic chip 110. Furthermore, the PCB 115 includes wings 130 that extend around the photonic chip 110 such that the PCB 115 includes three surfaces directly opposite of three sides at the periphery of the chip 110. The wings 130 provide additional area on the PCB 115 that can be used to route electrical signals to the photonic chip 110. As such, the transmitter 100 includes additional wire bonds that extend from the wings 130 of the PCB 115 to bond pads 120 on a respective side of the chip 110 facing the wings 130. As shown here, passive components 125 (e.g., capacitors, inductors, resistors, etc.) are mounted onto the wings 130. In one embodiment, these components are electrically coupled to the electrical IC 105 via the photonic chip 110 in order to, for example, filter out noise in the data or power signals in the IC 105.

However, a disadvantage of using the wings 130 is that they increase the overall width of the transmitter 100. That is, if the wings 130 were omitted, the width (i.e., the vertical direction of FIG. 1) of the transmitter 100 could be shrunk to the width of the photonic chip 110 (and assuming the width of the mounting plate 140 is also reduced). In one embodiment, the width of the transmitter 100 exceeds 7 millimeters which means the transmitter 100 may be too wide to fit in many standard transceivers. Thus, the width of the transmitter 100 may cause it to compete with the receiver for space within the transceiver which is limited. Another disadvantage is that the narrow width of the wings 130 limits routing. For example, wire bond pads, passive components, keep out zones for vias, and the number of lines of routing compete heavily for the limited space on the wings 130, especially since there is no fan out area in a narrow wing 130 with constant width.

The PCB 115, photonic chip 110, and IC 105 are mounted onto the plate 140. In one embodiment, the mounting plate 140 provides a rigid substrate that supports the PCB 115, photonic chip 110, and IC 105 which may be made up of materials that are more fragile than the material of the plate 140. The mounting plate 140 includes a fiber optic cable connection 145 which routes optical signals between an optical cable and the photonic chip 110. To do so, the mounting plate 140 may include one or more waveguides that extend from the connection 145 to the photonic chip 110. The mounting plate 140 also includes a laser assembly 155 which generates an optical signal (e.g., a continuous wave) that is then transmitted to the photonic chip 110. As shown, chip 110 includes a lens 150 on its top surface that is aligned with the laser assembly 155. Using the lens 150, the optical signal generated by the laser assembly 155 is directed into the photonic chip 110. Although not shown, the laser assembly 155 may include one or more wire bonds to the top surface of the photonic chip 110 which supply power to the laser assembly 155. Additionally, the laser assembly 155 may include its own lens as well as an optical isolator for generating the optical signal that is then transmitted to the lens 150 and into the photonic chip 110.

In one embodiment, a laser is directly mounted to the photonic chip 110 thereby eliminating the need for an additional laser substrate. However, in certain implementations, process limitations may not allow this configuration and mounting the laser off the chip 110 is preferred.

Although not shown in the top view provided in FIG. 1, the mounting plate 140 may at least extend underneath the photonic chip 110 and the wings 130. Furthermore, the plate 140 may also extend underneath at least a portion of the PCB 115 that includes the traces 135. The transmitter 100 may include adhesive material and one or more substrates that couple that PCB 115 and photonic chip 110 to the mounting plate 140 to provide mechanical support.

In one embodiment, when transmitting an optical signal using the transmitter 100, the laser 155 generates a continuous wave optical signal that is received by the photonic chip 110. Data signals transmitted on the PCB 115 are received by the electrical IC 105 which then uses these data signal to control a modulator in the photonic chip 110. For example, the IC 105 may using a modulation scheme where the data received on the PCB 115 is encoded into the optical signal by providing control signals to the photonic chip 110 which modulates an optical signal to encode the data into the optical signal. For instance, the laser may transmit a continuous wave into the lens 150 which, based on the control signals, is modulated in the photonic chip 110 according to a modulation schema (e.g., NRZ or PAM-4). The modulated optical signal is then transmitted using the connector 145 onto an optical fiber.

When functioning as a receiver, the transmitter 100 receives an optical signal from an optical cable coupled to connector 145. In one embodiment, the photonic chip 110 includes a detector that converts the optical signal into electrical signals which the IC 105 can demodulate and transmit as data signals on the PCB 115 to a coupled computing device. In this manner, the transmitter 100 can both transmit and receive data using optical signals.

Figure 2:
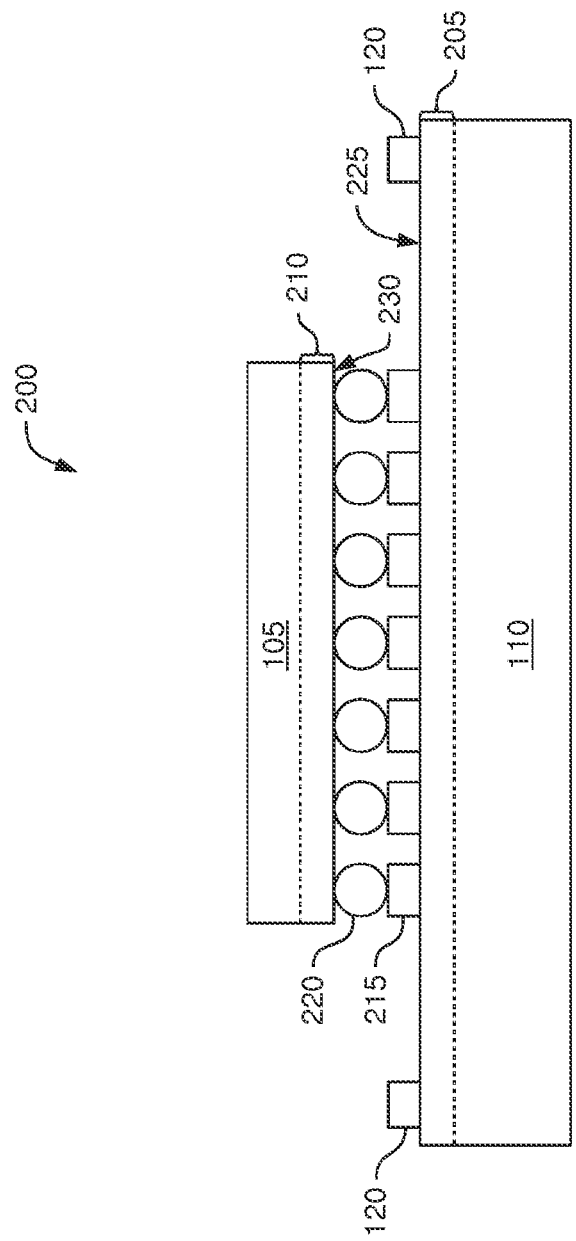
FIG. 2 illustrates an electrical IC coupled to a photonic chip, according to one embodiment described herein.

FIG. 2 illustrates an electrical IC coupled to a photonic chip, according to one embodiment described herein. Specifically, FIG. 2 illustrates a cross section 200 of a stack including photonic chip 110 and electrical IC 105 as shown by the section lines A-A in FIG. 1. For clarity, the cross section 200 excludes the wing 130 of the PCB 115 and the mounting plate 140.

In this embodiment, both the electrical IC 105 and the photonic chip 110 include redistribution areas that include one or more redistribution layers (RDLs). For example, IC 105 includes redistribution area 210 while chip 110 includes redistribution area 205. The RDLs in the respective areas 205, 210 includes metal routing layers that make IO pads (e.g., bond pads 120) available in other locations. For example, data or power signals provided at the bond pads 120 are routed in the RDLs in photonic chip 110 to the bond pads 215 on the top surface 225. In addition, the redistribution area 205 may be used to route these power or data signals to logic within the photonic chip 110 located below the area 205 or even to other bond pads 120. As an example of the latter, one bond pad 120 may receive a DC power signal that is then routed via redistribution area 205 to another bond pad 120 which relays the DC power to the laser using a wire bond.

The bond pads 215 are electrically and mechanically coupled to a bottom surface 230 of the electrical IC 105 using solder bumps to form solder connections 220. The bottom surface 230 also includes bond pads corresponding to the solder bumps 220 (or Cu-pillars). The signal received from via the solder connections 220 are then routed to different parts of the electrical IC using the RDLs in the redistribution area 210. Moreover, the process also works in reverse where the logic within the electrical IC uses the RDLs in area 210 and solder connections 220 to route signals to components in the photonic chip 110 (e.g., an optical modulator) and/or bond pads 120.

The number of RDLs and the density of the metal in the routing layers in the two redistribution areas 210 and 205 may vary because the fabrication techniques using to form the electrical IC 105 and the photonic chip 110 may vary. Although both the IC 105 and chip 110 may be fabricated from a similar substrate material (e.g., a semiconductor such as silicon), the different components in the IC 105 (e.g., CMOS circuitry) and chip 110 (e.g., waveguides or optical modulators) may require different fabrication techniques and processes. The techniques used to fabricate the IC 105 may permit the IC 105 to have more RDLs than the chip 110. Because of the constraints on the number of RDLs in the photonic chip 110, the chip 110 may not include enough routing paths in the redistribution area 205 to satisfy the desired number of signals passing from the bond pads 120 to the electrical IC 105.

Figure 3:
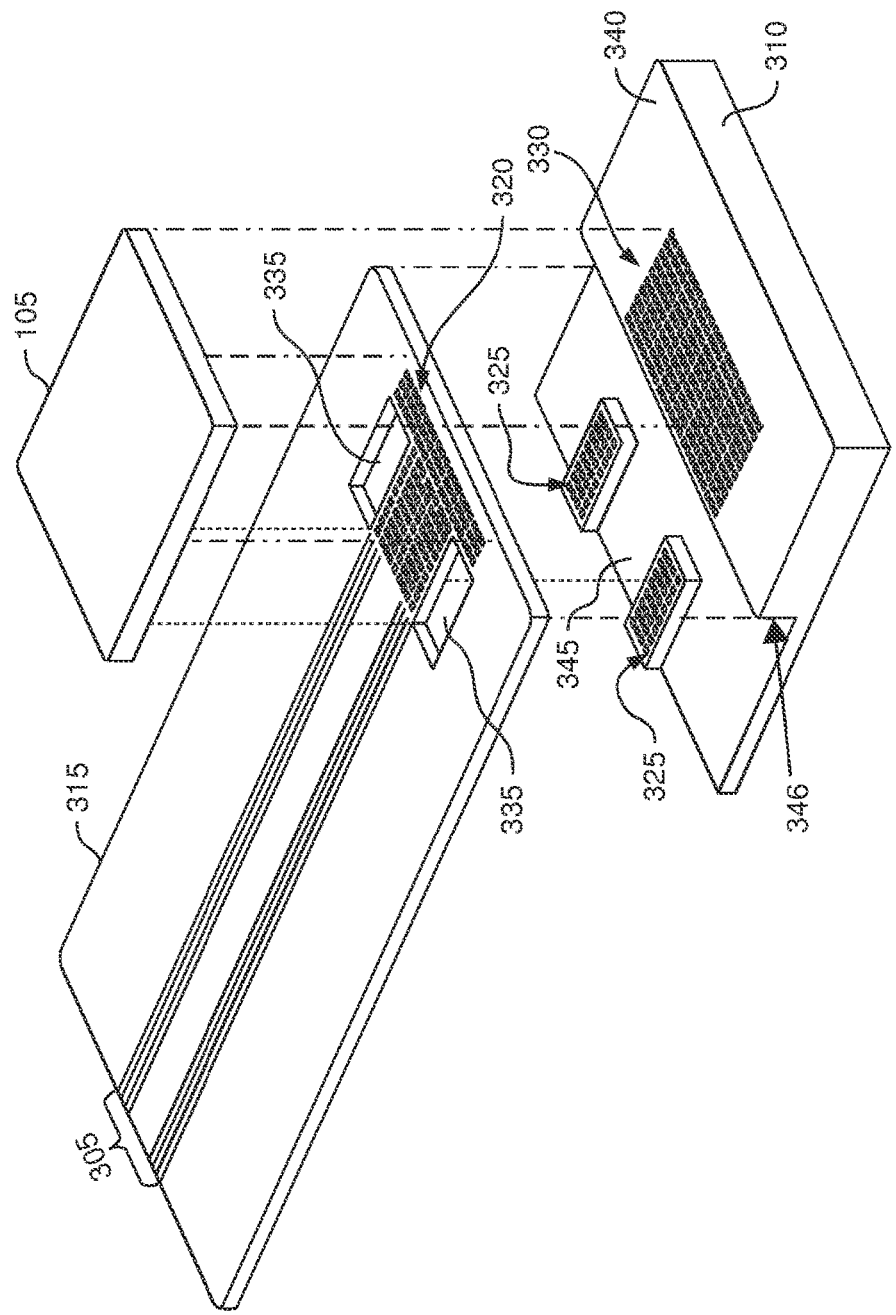
FIG. 3 illustrates disposing a flexible PCB between an electrical IC and a photonic chip, according to one embodiment described herein.

FIG. 3 illustrates disposing at least a portion of a PCB 315 between an electrical IC 105 and a photonic chip 310, according to one embodiment described herein. Like the electrical IC disclosed above, the IC 105 shown here includes an interface on a bottom surface facing the PCB 315 and photonic chip 310 that permits a plurality of solder connections to be made (e.g., a flip chip arrangement). However, instead of the solder connections being between only the IC 105 and a photonic chip, in FIG. 3 a first plurality of solder connections are between the IC 105 and the PCB 315 and a second plurality of solder connections are between the IC 105 and the photonic chip 310.

As shown, the PCB 315 includes a plurality of traces 305 that terminate at bond pads in the bond pad region 320. Although not shown, the PCB 315 may include other layers with traces that terminate at bond pads in region 320. FIG. 3 includes dotted lines that illustrate that a portion of the electrical IC 105 overlays the bond pad region 320. Solder connections are then formed to communicatively couple the traces 305 in the PCB 315 to the IC 105.

Although PCB 315 is specifically shown and discussed in the embodiments herein, this disclosure is not limited to such. For example, other types of signal routing materials may be placed between the electrical IC 105 and the photonic chip 310 as shown in FIG. 3. Other types of suitable materials include multilayer ceramic, glass, silicon, semiconductor, or any type of interposer type of material or substrate.

The photonic chip 310 also includes a bond pad region 330 that is overlaid by electrical IC 105. For example, the region 330 aligns with bond pads on the bottom surface of the IC 105 which enable solder connections to communicatively couple chip 310 to IC 105. Furthermore, the bond pad region 330 is located on a top surface 340 that is closest to the electrical IC 105. In addition, the photonic chip 310 includes a recessed surface 345 relative to the top surface 340. The recessed surface 345 is defined by a relative reduction in thickness of the photonic chip 310 from the surface on which the bond pad region 330 is disposed. For example, when fabricating the photonic chip, the recessed surface 345 is formed by etching away a portion of the chip 310. In this way, a sidewall 346 is formed connecting the top surface 340 to the recessed surface 345. The sidewall 346 and the recessed surface 345 define an alignment area sized and shaped to receive a portion of the PCB 315. In one embodiment, the height of the sidewall 346 (and thus the depth of the alignment area) is equal to or greater than a thickness of the PCB 315 so that when the PCB 315 is placed within the alignment area the bond pad region 320 lies substantially in the same plane as the bond pad region 330 and the top surface 340. As used here, lying "substantially in the same plane" means that the regions 320 and 330 are sufficiently aligned to enable solder connections to the same surface, e.g., the bottom surface of the electrical IC 105.

The solder connections used to connect the bottom surface of the electrical IC 105 to the regions 320 and/or 330 may include C4 solder bumps, Cu-pillars with solder cap as well as flux (SnAgCu and the like) or flux free connections. Moreover, although solder connections are specifically discussed, in other embodiments, different types of electrical connections may be used to connect the bottom surface of the electrical IC 105 to the regions 320 and/or 330. Suitable alternatives include (anisotropic) conductive epoxy/film or anodic/friction/ultra-sonic gold to gold bonding or Au stud bonding.

The photonic chip 310 includes raised features 325 within the alignment area that receives the PCB 315. So that the raised features 325 do not interfere with placing the PCB 315 into the alignment area, the PCB 315 defines apertures 335 having dimensions suitable for permitting the raised features 325 to pass through. In one embodiment, the top surfaces of the raised features 325 are on the same plane as the top surface 340. Furthermore, the top surfaces of the raised features 325 are used as bonding surfaces that are coupled to the bottom surface of the electrical IC 105. In one embodiment, the raised features 325 include respective bond pad regions for bonding to the bottom surface of the electrical IC 105. Alternatively, the raised features 325 may be attached to the bottom surface of IC 105 using an adhesive such as an epoxy. In this manner, the raised features 325 may provide additional mechanical stability for coupling the electrical IC 105 to the photonic chip 310. Moreover, in one embodiment, the raised features 325 may serve as alignment guides for disposing the PCB 315 into the alignment area defined by the recessed surface 345.

Although the raised features 325 are shown with as quadrilaterals, this is not intended to be limiting. For example, the features 325 may have a frustconical profile that facilitates guiding the PCB 315 into the alignment region with return. Furthermore, the chip 310 may include any number of the raised features 325, or the chip 310 may include a recessed surface 345 without any of the raised features 325. In one embodiment, the chip 310 could be diced all the way through at sidewall 346 eliminating surface 345 and any feature 325 completely.

Figure 4:
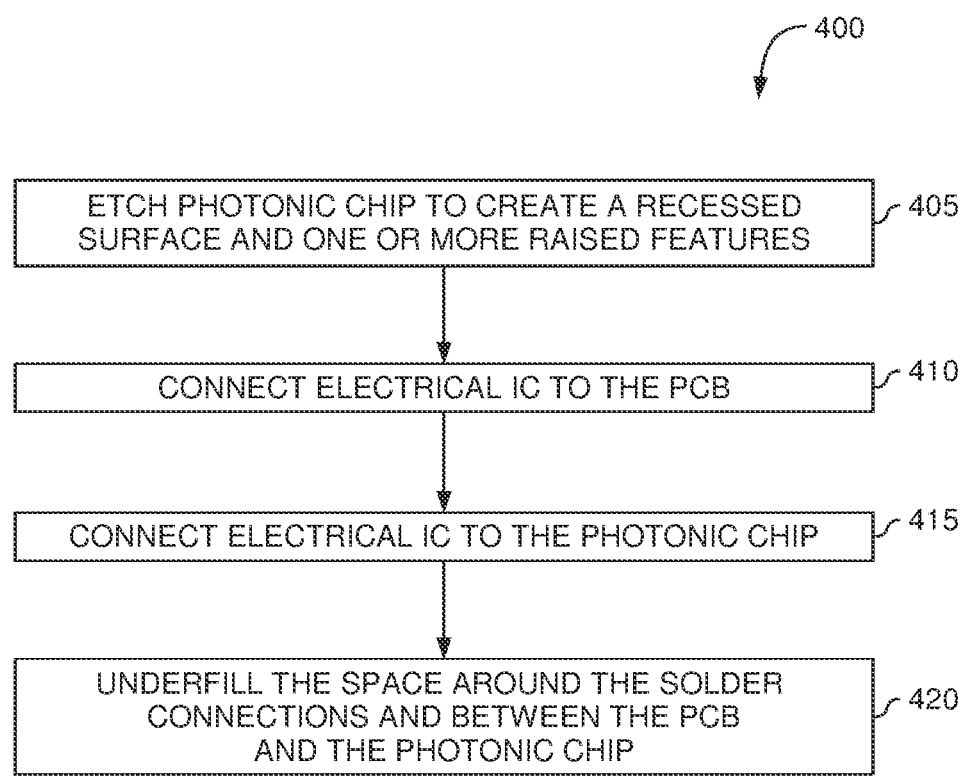
FIG. 4 is a method for connecting the electrical IC to both the PCB and photonic chip, according to one embodiment described herein.

FIG. 4 is a method 400 for connecting the electrical IC to both the PCB and optical chip, according to one embodiment described herein. At block 405, the photonic chip is etched to create the recessed surface and one or more raised features. The etching may be performed using a chemical process like deep reactive-ion etching (DRIE) and may be performed by the manufacture when fabricating the photonic chip or in a post-processing step performed by a purchaser of the chip. As shown in FIG. 3, the material removed when creating the recessed surface and the raised features define an alignment area that matches the features of a portion of the PCB. In one embodiment, the top surface 340 may be etched 100-200 microns to form the recessed surface 345. In one embodiment, doing so etches through any redistribution layers located at the top surface 340 which are typically 5-20 microns deep.

At block 410, the electrical IC is connected to the PCB. In one example, bonding pad regions in the IC and PCB are aligned such that a plurality of solder connections can be made. In one embodiment, solder balls are first deposited onto the bond pads either the electrical IC or the PCB which are then melted once the PCB and electrical IC are aligned thereby creating the solder connections. The present embodiments are not limited to any particular technique for creating the solder connections. For example, the solder balls may be reflowed or thermal compression may be used.

At block 415, the electrical IC is connected to the photonic chip. This connection may occur using the same technique as performed in block 410. For example, solder balls are deposited on either the IC or the photonic chip and then melted in order to create solder connections. Moreover, because the IC is already coupled to the PCB, connecting the IC to the photonic chip also means a portion of the PCB is disposed in the alignment area defined by the recessed surface and the raised features formed at block 405 and shown in FIG. 3. However, in one embodiment, there is no active alignment performed between the PCB and the photonic chip. That is, the PCB and photonic chip are formed such that there is enough clearance for the PCB not to interfere with the features on the optical chip when the optical chip is bonded to the IC. Conversely, the PCB or the photonic chip may include alignment features in a region where the two components interface that aid in aligning the bonding regions of the photonic chip and the electrical IC.

Moreover, before connecting the IC to the photonic chip, one or more process steps may be performed to ensure that the electrical connections made during block 415 do not harm the connections made at block 410. For example, the PCB solder joints may first be underfilled or the composition of the solder used during block 410 may "freeze out" when formed such that the solder with not reflow again. However, these are only two examples. One of ordinary skill will recognize there are multiple other solutions to ensure the electrical connections formed during block 410 are not affected by forming the connections at block 415.

At block 420, an underfill material is injected into the space around the solder connections between the IC and the PCB and between the IC and photonic chip. The underfill material, which is electrically insulative, provides mechanical stability and removes at least a portion of the mechanical stress on the solder connections. In addition, at block 420, the underfill material may be injected between the PCB and the photonic chip in the alignment area. For example, the volume of the alignment area may be greater than the space required by the portion of the PCB placed in this area. To improve mechanical stability, the underfill material is injected into any gap between the PCB and the photonic chip in the alignment region.

Figure 5:
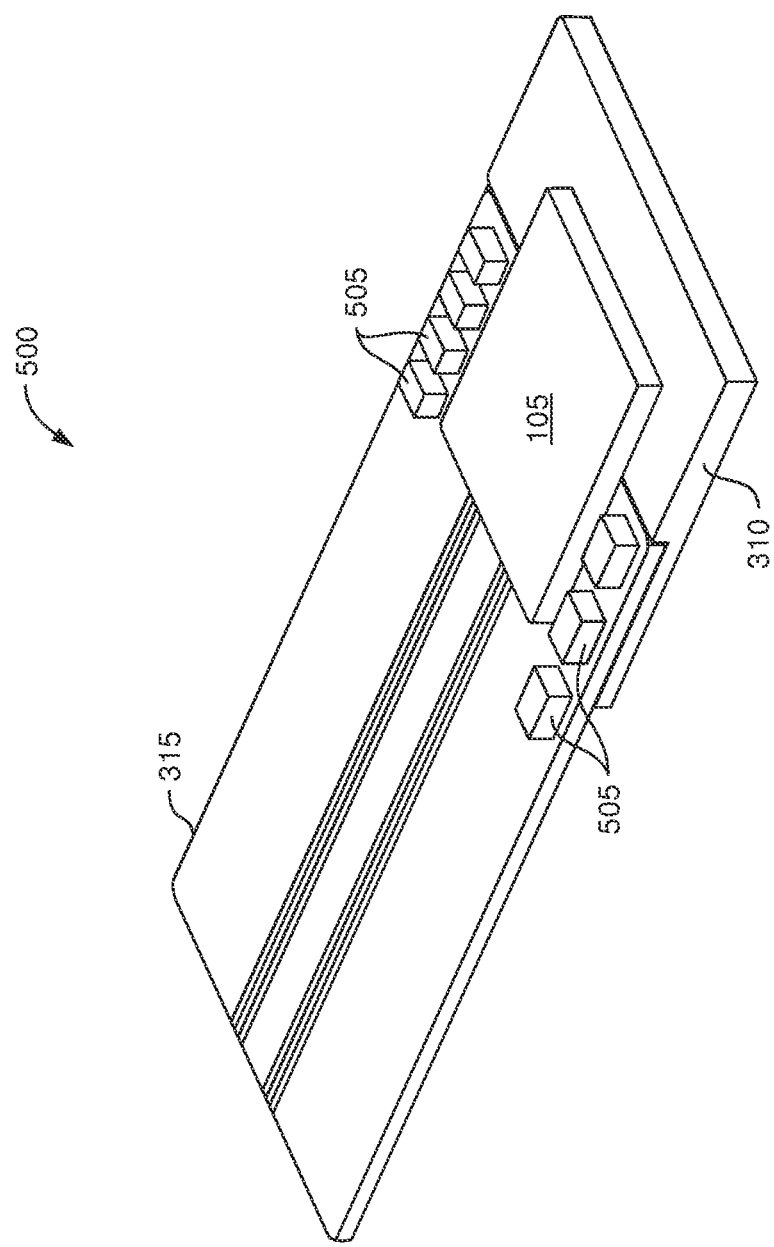
FIG. 5 is a plan view of the PCB mounted between the electrical IC and the photonic chip, according to one embodiment described herein.

FIG. 5 is a plan view of the PCB 315 mounted between the electrical IC 105 and the photonic chip 310, according to one embodiment described herein. That is, system 500 illustrates the result of performing method 400 where the IC 105 includes direct solder connections to both the PCB 315 and the photonic chip 310. In addition, passive components 505 (e.g., resistors, capacitors, inductors, etc.) are mounted onto the PCB 315. However, unlike in FIG. 1 where the passive components 125 are mounted on wings 130 that extend away from a main body of the PCB 115, here, the passive components 505 are mounted on the main body of the PCB 315. Moreover, the PCB 315 is not wider than the photonic chip 310 unlike in FIG. 1. As such, any package having a width sufficient to accommodate the width of the photonic chip 310 is also sufficient to accommodate the width of the PCB 315.

Additionally, by using solder connections to transmit and receive signals between the PCB 315 and IC 105, the added capacitance, inductance and/or resistance from the wire bonds and RDLs in the photonic chip 310 is avoided. Moreover, because the resistance of a solder connection may be less than the resistance of a wire bond, fewer solder connections than wire bonds may be need to accommodate the signals transferred between the PCB 315 and IC 105. That is, for high-speed signals, multiple parallel wire bonds may be needed to ensure the signal is not degraded. Because solder connections have less resistance, fewer parallel solder connections (or only one solder connection) between the PCB 315 and IC 105 may be needed to transfer the same high-speed signal. Thus, to transfer the same number of signals, the system 500 may use less solder connections than a system that uses wire bonds.

Figure 6A:
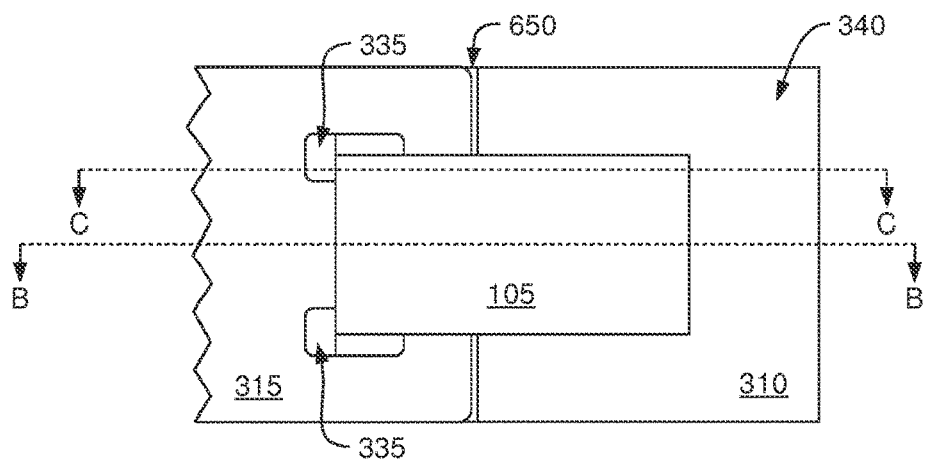
FIG. 6A is a top view of the PCB mounted between the electrical IC and the photonic chip, according to one embodiment described herein.

FIG. 6A is a top view of the PCB 315 mounted between the electrical IC 105 and the optical chip 310, according to one embodiment described herein. As shown, the IC 105 directly overlays both a portion of the photonic chip 310 and the PCB 315. In this embodiment, the leftmost edge of the electrical IC 105 is aligned with the leftmost edge of the photonic chip 310 but this is not a requirement.

The apertures 335 provide respective openings so that the raised features (not shown) of the photonic chip can pass through the PCB 315 and couple to the electrical IC 105. Moreover, the rightmost edge of the PCB 315 may not directly abut the top surface 340 of the photonic chip 310 thereby creating a gap 650. After the PCB 315 is aligned with the IC 105 and the solder connections are formed, the gap 650 may be filled with the underfill material to increase the mechanical support between the photonic chip 310 and the PCB 315.

Figure 6B:
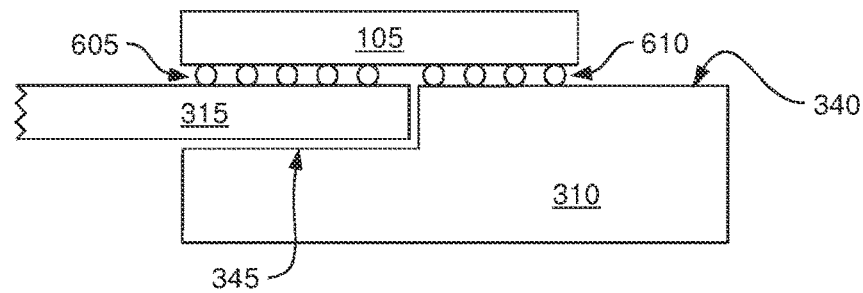
FIGS. 6B-6C are cross sections of the PCB mounted between the electrical IC and the photonic chip, according to embodiments described herein.
Figure 6C:
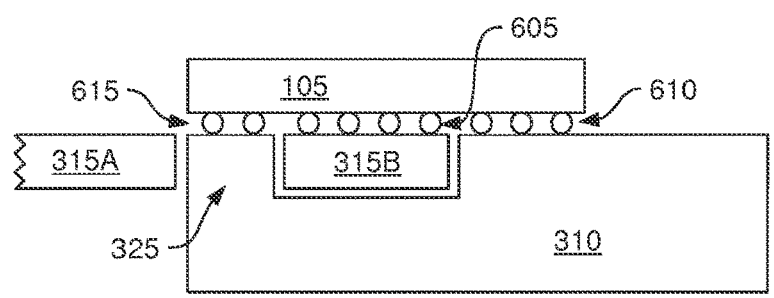

FIGS. 6B-6C are cross sections of the PCB mounted between the electrical IC and the optical chip, according to embodiments described herein. Specifically, FIG. 6B illustrates a cross section along the dotted line B-B in FIG. 6A. As shown, the electrical IC 105 includes a plurality of solder connections 605 to PCB 315 and a plurality of solder connections 610 to photonic chip 310. In one embodiment, there are no wire bond connections in any of the electrical paths between the PCB 315 and the IC 105. However, if desired, there could be direct wire bond connections between the PCB and photonics chip 310 to have a direct line between the two components or offer supplemental routing capability. In one embodiment, these lines are primarily DC voltage lines.

Although not shown in FIG. 6B, in one embodiment, the PCB 315 includes direct solder connections to the photonics chip 310. For example, the PCB 315 may carry data or power signals intended for the photonic chip 310. A bottom surface of the PCB 315 (i.e., the surface facing the recessed surface 345 of the photonic chip 310) may include a bond pad region that aligns with a bond pad region on the recessed surface 345. Solder connections from the PCB 315 to the photonic chip 310 may be formed the same time the solder connections between the IC 105 and photonic chip 310 are formed. Alternatively, a flex PCB 315 could partially extend beyond the sidewall connecting the recessed surface 345 and the top surface 340 (in a region not covered by the IC 105) to bend upward to clear the edge created by the sidewall and eventually align with surface 340 so that the PCB can be bonded directly to the photonic chip 310 on the top surface 340. However, if there is no solder connection between the PCB 315 and chip 310, signals from the PCB 315 that are intended for the photonic chip 310 may be routed via the RDLs in the IC 105 and then to the photonic chip 310.

In the illustrated example, the PCB 315 does not directly contact either the recessed layer 345 or the surface of the chip 310 that connects the recessed surface 345 to the top surface 340. Forming the recessed layer 345 so that the alignment region has a greater volume than the portion of the PCB 315 in the alignment region may be preferred to permit greater flexibility when aligning the photonic chip 310 to the IC 105. As mentioned above, any gap between the PCB 315 and photonic chip 310 may be filed with the underfill material. However, in another embodiment, the alignment region may be etched to the same dimensions as the PCB 315 and the apertures 335 so that when the PCB 315 (assuming the solder connections between the PBC 315 and IC 105 are already formed) is disposed into the alignment region of the photonic chip 310, the bond pad region on the IC 105 automatically aligns to the bond pad region on the top surface 340 of the photonic chip 310—i.e., the bond pad regions are self-aligning. However, doing so may depend on the PCB edge tolerances and the pitch of the bond pads to ensure proper alignment.

FIG. 6C illustrates a cross section along the dotted line C-C in FIG. 6A. Because the line C-C cuts across one of the apertures 335, the cross section in FIG. 6C includes two portions of the PCB 315—i.e., portion 315A and portion 315B. As shown, the raised feature 325 separates PCB portion 315A from PCB portion 315B. The raised feature 325 includes a plurality of solder connections 615 to the IC 105 although in other embodiments different connection techniques may be used to mechanical couple the raised feature 325 to the IC 105. In one embodiment, the solder connections 615 do not provide electrical connections between the photonic chip 310 and the IC 105. That is, data and power signals are not transferred between chip 310 and IC 105 using the connections 615. In one example, by etching the chip 310 to create the alignment area that receives PCB portion 315B, electrical connections between the raised feature 325 and the rest of the photonic chip 310 are severed, and thus, the solder connections 615 may be used only to provide mechanical support.

However, in other embodiments, the solder connections 615 may be used to transfer signals between the photonic chip 310 and IC 105. For example, the signals may be routed down through the raised feature 325 and underneath the alignment area to reach the rest of the photonic chip 310. In one embodiment, the raised feature 325 includes a through silicon via (TSV) that transfers the signal to the backside of the chip 310 where a RDL could route the signal laterally.

Another TSV could then be used to route the signal up from the backside RDL to the RDLs located proximate to the top surface 340.

Figure 7:
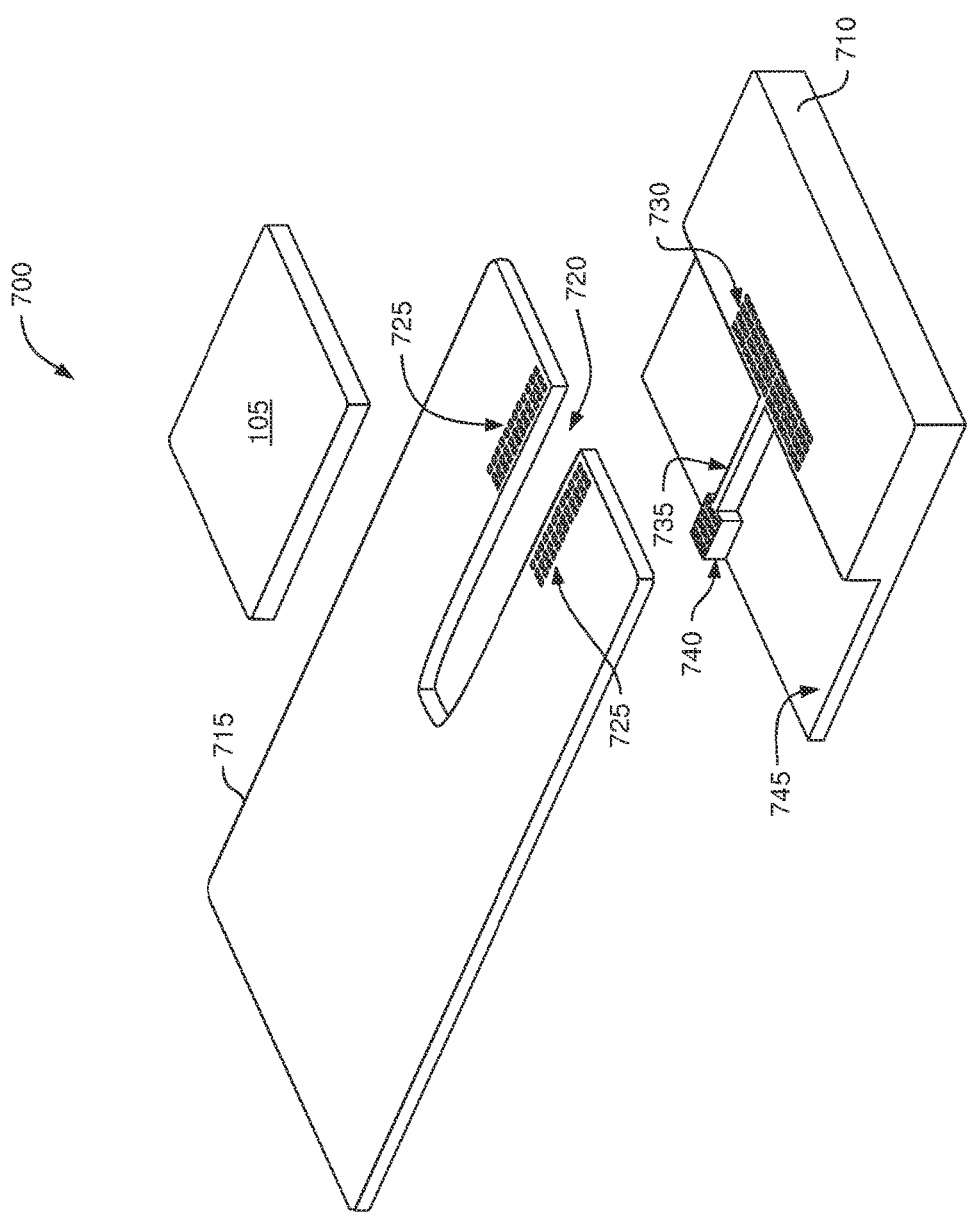
FIG. 7 illustrates disposing a PCB between an electrical IC and an photonic chip, according to one embodiment described herein.

FIG. 7 illustrates disposing a PCB 715 between an electrical IC 105 and a photonic chip 710, according to one embodiment described herein. As shown in this exploded view, the PCB 715 includes one or more surfaces that define an aperture 720 which includes dimensions that are the same or exceed the dimensions of raised features 740 and 735 on the photonic chip 710. As such, when a bottom surface of the PCB 715 facing the photonic chip 710 is brought into contact with a recessed surface 745, the raised features 740 and 735 are within the volume of the aperture 720. Stated differently, the aperture 720 provides a volume where the raised features 740 and 735 can extend through the PCB 715 to connect to bond pads on the bottom surface of the electrical IC 105.

The PCB 715 includes bond pad regions 725 that, like the bond pad region 320 in FIG. 3, permit direct solder connections between the PCB 715 and IC 105. Moreover, the raised feature 740 includes a bond pad region on a top surface facing the bottom surface of the electrical IC 105 which is used to form direct solder connections to the IC 105. Although not shown, the raised feature 735 may also include a bond pad region for forming solder connections to the bottom surface of the IC 105. In one embodiment, the bond pad region on the raised feature 740 is on the same plane as a bond pad region 730 on the top surface of the chip 710. Further still, when placed in the alignment region formed by recessing the surface 745 from the top surface of the photonic chip, the bond pad regions 725 may also be substantially within the same plane as the bond pad regions 740 and 730.

In one embodiment, the solder connections between the raised feature 740 and the IC 105 may permit the transfer of electrical signals. Furthermore, the raised feature 735 may include a portion of one or more RDLs that permit the signals transferred on the solder connections of feature 740 to reach other portions of the photonic chip 710. Thus, the solder connections between raised feature 740 and IC 105 serves dual purposes: transfer electrical signals between the IC 105 and the photonic chip 710 and improve mechanical stability. However, in one embodiment, these solder connections may be used only to provide additional mechanical support between the chip 710 and the electrical IC 105.

In one embodiment, the raised features 740 and 735 permit the photonic chip to receive laser light at the leftmost side of the photonic chip 710. In contrast, FIG. 1 illustrates that the photonic chip 110 receives the optical signal from the laser assembly 155 on its rightmost side. Instead, in FIG. 7, the laser may be aligned at the leftmost side of the chip 710 and below the PCB 715. The raised features 740 and 735 may include one or more waveguides that then transmit the optical signal generated by the laser to the rest of the photonic chip 710—e.g., in a direction towards the rightmost side of the chip 710. In one example, the optical signal travels through the photonic chip 710 without having to be redirected 180 degrees. That is, the optical signal can generally travel from the leftmost of chip 710 to the rightmost side of chip 710 where it is then transmitted to, for example, a LC connector. In contrast, in FIG. 1 the optical signal transmitted by the laser assembly 155 may both enter, and exit, at the rightmost side of the chip 110 which requires the photonic chip to redirect the optical signal by 180 degrees.

Figure 8A:
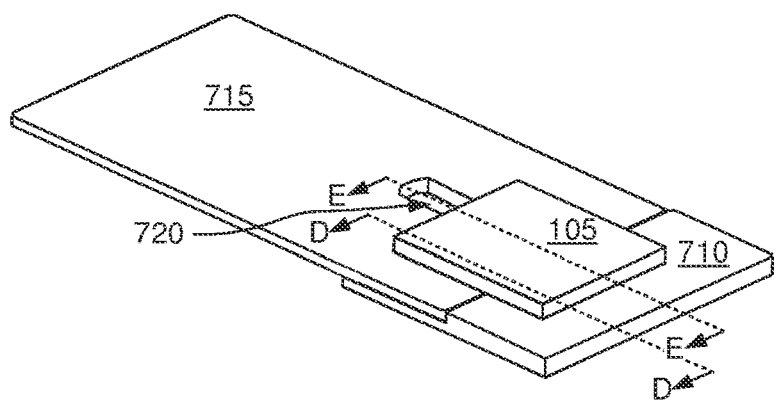
FIG. 8A is a plan view of the PCB mounted between the electrical IC and the photonic chip, according to one embodiment described herein.

FIG. 8A is a plan view of the PCB 715 mounted between the electrical IC 105 and the photonic chip 710, according to one embodiment described herein. As shown, the IC 105 directly overlays both a portion of the photonic chip 710 and the PCB 715. In this embodiment, the leftmost edge of the electrical IC 105 is aligned with the leftmost edge of the photonic chip 710 but this is not a requirement.

The aperture 720 in PCB 715 provides an opening so that the raised features (not shown) of the photonic chip 710 pass through the PCB 715 and couple to the electrical IC 105. Moreover, the rightmost edge of the PCB 315 may not directly abut the photonic chip 310 thereby creating a gap. After the PCB 715 is aligned with the IC 105 and the solder connections are formed, this gap may be filled with the underfill material to increase the mechanical support between the photonic chip 710 and the PCB 715.

Figure 8B:
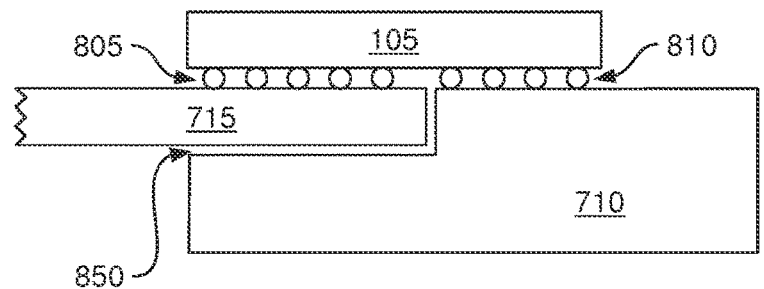
FIGS. 8B-8C are cross sections of the PCB mounted between the electrical IC and the photonic chip, according to one embodiment described herein.

FIG. 8B is a cross section of the PCB 715 mounted between the electrical IC 105 and the photonic chip 710, according to one embodiment described herein. Specifically, FIG. 8B is a cross section taken along the line D-D in FIG. 8A. As such, FIG. 8B illustrates a plurality of solder connections 805 between the PCB 715 and the IC 105 and a plurality of solder connections 810 between the photonic chip 710 and IC 105. In another embodiment, a bottom surface of the PCB 715 facing the chip 710 may be used to form direct solder connections between the PCB 715 and the photonic chip 710. However, in the absence of direct solder connections between the PCB 715 and the chip 710, the RDLs in the IC 105 or wire bonds may be used to transfer signals between PCB 715 and chip 710.

Moreover, although shown with a gap 850 between the PCB 715 and the chip 710 which may be filled with underfill material, in another embodiment, the alignment region in the chip 710 that receives the PCB 715 may be etched to the same dimensions as the PCB 715 and the apertures 720 so that when the PCB 715 (assuming the solder connections between the PBC 715 and IC 105 are already formed) is disposed into the alignment region, the bond pad region on the IC 105 automatically aligns to the bond pad region on the top surface of the photonic chip 710—i.e., the bond pad regions are self-aligning.

Figure 8C:
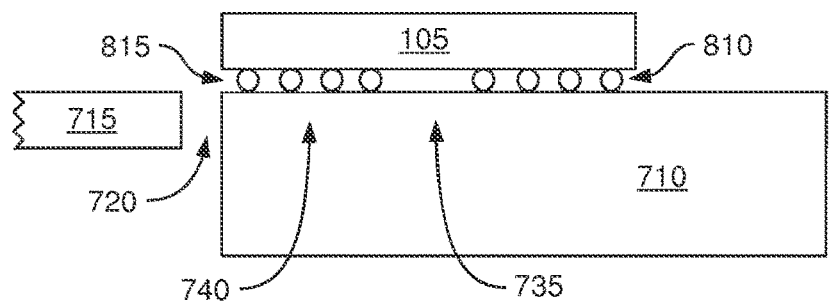

FIG. 8C is a cross section of the PCB 715 mounted between the electrical IC 105 and the photonic chip 710, according to one embodiment described herein. Specifically, FIG. 8C is a cross section taken along the line E-E in FIG. 8A. As such, FIG. 8C illustrates a plurality of solder connections 810 between the photonic chip 710 and IC 105 and a plurality of solder connections 815 between the raised feature 740 and the IC 105. As mentioned above, the chip 710 may also include solder connections between a top surface of the raised feature 735 and the IC 105. The solder connections 815 may be used to both transmit electrical signals and provide mechanical stability between IC 105 and the photonic chip 710 or may be used only to provide mechanical stability. Furthermore, the raised features 740 and 735 may include one or more waveguides for receiving an optical signal introduce by a laser assembly mounted to the left of the photonic chip 710 and below the bottom surface of the PCB 715. Alternatively, a portion of the laser assembly may be mounted in the aperture 720.

The flowchart and block diagrams in the Figures illustrate the architecture, functionality and operation of possible implementations of systems, methods and computer program products according to various embodiments. In this regard, each block in the flowchart or block diagrams may represent a module, segment or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In view of the foregoing, the scope of the present disclosure is determined by the claims that follow.

We claim:

1. A photonic chip, comprising:
a unitary semiconductor body comprising a first surface, a second surface, and a third surface that are all normal to a common direction, wherein the second surface is recessed relative to the first surface along the common direction to form an alignment area, wherein a depth of the alignment area is greater than or equal to a thickness of a portion of a printed circuit board (PCB), thereby permitting a top surface of the PCB to substantially align with the first surface when the PCB is placed in the alignment area, wherein the third surface is opposite the first surface on the photonic chip, wherein the second surface is between the first and third surfaces;
a bonding region disposed on the first surface, the bonding region comprises a plurality of bond pads configured to form electrical connections to an electrical integrated circuit (IC);
an optical component electrically coupled to at least one of the plurality of bond pads, the optical component is configured to transmit an optical signal within the photonic chip; and
a raised feature of the unitary semiconductor body, wherein the raised feature extends from the second surface along the common direction, wherein a bonding surface of the raised feature is substantially within a same plane as the first surface, the bonding surface is configured to couple to the electrical IC.

2. The photonic chip of claim 1, wherein the bonding surface of the raised feature includes a second plurality of bond pads configured to form solder connections to the electrical IC.

3. The photonic chip of claim 2, wherein the second plurality of bond pads are electrically isolated such that electrical signals are not received or transmitted to the electrical IC via the second plurality of bond pads.

4. The photonic chip of claim 1, wherein the raised feature includes a waveguide for routing the optical signal, wherein the optical signal is received from an external light source at a first side of the photonic chip and emitted, via the waveguide, on a second, opposite side of the photonic chip.

5. The photonic chip of claim 1, wherein the optical component comprises a modulator configured to alter a phase of the optical signal based on signals received via the at least one of the plurality of bond pads.

6. An optical system, comprising:
an electrical IC comprising a bottom surface;
a photonic chip comprising semiconductor material with a top surface and a recessed surface both facing the bottom surface of the IC, wherein the recessed surface is further from the bottom surface of the IC than the top surface relative to a direction that is normal to the top and recessed surfaces, and wherein the IC overlays both the top and recessed surfaces, wherein the photonic chip further comprises:
a raised feature extending from the recessed surface towards the bottom surface of the IC, wherein a bonding surface of the raised feature is within a same plane as the top surface of the photonic chip and the bonding surface is coupled to the bottom surface of the IC; and
a portion of a signal routing material disposed between the bottom surface of the IC and the recessed surface of the photonic chip, the portion of the signal routing material and the top surface of the photonic chip each comprising a plurality of respective electrical connections to the bottom surface of the IC, wherein the signal routing material comprises one of a rigid PCB and a flexible PCB, wherein the portion of the signal routing material includes one or more surfaces defining an aperture through which the raised feature extends.

7. The optical system of claim 6, wherein a top surface of the portion of the signal routing material comprising the plurality of electrical connections is within the same plane as the top surface of the photonic chip.

8. The optical system of claim 6, wherein the electrical IC comprises at least one redistribution layer establishing a signal path to transfer electrical signals between the portion of the signal routing material and the photonic chip, wherein there is no direct electrical connection between the portion of the signal routing material and the photonic chip.

9. The optical system of claim 6, wherein a gap between the recessed surface of the photonic chip and the portion of the signal routing material is filled with an underfill material.

10. The optical system of claim 6, wherein the bonding surface of the raised feature includes a plurality of solder connections to the bottom surface of the IC.

11. The optical system of claim 6, wherein the raised feature includes an optical component for routing an optical signal received from an external light source at a first side of the photonic chip to a second, opposite side of the photonic chip.

12. The optical system of claim 6, further comprising:
a light source configured to transmit an optical signal into the photonic chip where the optical signal is modified; and
a connector configured to receive the modified optical signal from the photonic chip and transmit the modified optical signal onto an optical cable.

13. A method, comprising:
connecting a signal routing material to a bottom surface of an electrical IC using a first plurality of electrical connections;
disposing a portion of the signal routing material comprising the first plurality of electrical connections in an alignment region of a photonic chip, the alignment region is defined, at least in part, by a distance between a recessed surface of the photonic chip and a top surface of the photonic chip relative to a direction normal to both the recessed and top surfaces, wherein the top and recessed surfaces both face the bottom surface of the IC, and wherein the portion of the signal routing material is between the bottom surface of the IC and the recessed surface of the photonic chip; and
connecting the bottom surface of the IC to the top surface of the photonic chip using a second plurality of electrical connections,
wherein the IC overlays both the top and recessed surfaces of the photonic chip, wherein the photonic chip comprises a raised feature extending from the recessed surface towards the bottom surface of the IC, wherein a bonding surface of the raised feature is within a same plane as the top surface of the photonic chip and the bonding surface is coupled to the bottom surface of the IC, and wherein the portion of the signal routing material includes one or more surface defining an aperture through which the raised feature extends.

14. The method of claim 13, wherein disposing the portion of the signal routing material in the alignment region is performed after connecting the signal routing material to the bottom surface of the IC, wherein the first plurality of electrical connections comprises solder connections.

15. The method of claim 13, wherein connecting the bottom surface of the IC to the top surface of the photonic chip is performed after disposing the portion of the signal routing material in the alignment region, wherein the second plurality of electrical connections comprises solder connections.

16. The method of claim 13, further comprising:
filling a gap between the recessed surface of the photonic chip and the portion of the signal routing material using an underfill material.

17. The method of claim 13, wherein a top surface of the portion of the signal routing material comprising the first plurality of electrical connections is within the same plane as the top surface of the photonic chip.

\* \* \* \* \*